United States Patent
Wagner et al.

(10) Patent No.: US 8,961,701 B2
(45) Date of Patent: *Feb. 24, 2015

(54) METHOD AND SYSTEM OF DRYING A MICROELECTRONIC TOPOGRAPHY

(75) Inventors: Mark I. Wagner, Austin, TX (US); James P. DeYoung, Dallas, TX (US)

(73) Assignee: Lam Research Corporation, Fremont, CA (US)

( * ) Notice: Subject to any disclaimer, the term of this patent is extended or adjusted under 35 U.S.C. 154(b) by 1026 days.

This patent is subject to a terminal disclaimer.

(21) Appl. No.: 12/562,450

(22) Filed: Sep. 18, 2009

(65) Prior Publication Data

US 2010/0071726 A1    Mar. 25, 2010

Related U.S. Application Data

(63) Continuation-in-part of application No. 12/237,070, filed on Sep. 24, 2008, now Pat. No. 8,153,533.

(51) Int. Cl.
*B08B 3/04* (2006.01)
*H01L 21/67* (2006.01)
*H01L 21/02* (2006.01)

(52) U.S. Cl.
CPC .... *H01L 21/67034* (2013.01); *H01L 21/02057* (2013.01); *H01L 21/67028* (2013.01); *Y10S 134/902* (2013.01)
USPC ................ 134/25.4; 134/26; 134/30; 134/36; 134/42; 134/902

(58) Field of Classification Search
CPC .......... B08B 3/04; B08B 7/00; B08B 7/0021; F26B 7/00; F26B 9/00; F26B 21/10
USPC .......................... 134/25.4, 26, 30, 36, 42, 902
See application file for complete search history.

(56) References Cited

U.S. PATENT DOCUMENTS

| | | | |
|---|---|---|---|
| 4,948,685 A | | 8/1990 | Ohsawa et al. |
| 5,417,768 A | * | 5/1995 | Smith et al. .................... 134/10 |

(Continued)

FOREIGN PATENT DOCUMENTS

| | | |
|---|---|---|
| JP | 2001-165568 | 6/2001 |
| JP | 2003-206497 | 7/2003 |

(Continued)

OTHER PUBLICATIONS

Notice of Allowance issued Dec. 12, 2011 in U.S. Appl. No. 12/237,070.

(Continued)

*Primary Examiner* — Bibi Carrillo
(74) *Attorney, Agent, or Firm* — Beyer Law Group LLP

(57) ABSTRACT

Drying a microelectronic topography. At least some of the illustrative embodiments are methods that include placing a microelectronic topography inside a process chamber, providing a non-aqueous liquid to the process chamber until at least 90% of the volume of the process chamber contains the non-aqueous liquid, pressurizing the process chamber by way of a fluid different than the non-aqueous liquid, ceasing activity with respect to the process chamber until the non-aqueous liquid and fluid form a mixture that is substantially homogenous, venting the process chamber while simultaneously providing the fluid to the process chamber, and venting the process chamber in a manner which prevents formation of liquid in the process chamber.

28 Claims, 3 Drawing Sheets

(56) References Cited

U.S. PATENT DOCUMENTS

| | | | |
|---|---|---|---|
| 5,962,743 A | 10/1999 | Gruber et al. | |
| 6,100,203 A | 8/2000 | Kil et al. | |
| 6,306,754 B1 | 10/2001 | Agarwal | |
| 6,334,266 B1 * | 1/2002 | Moritz et al. | 34/337 |
| 6,558,475 B1 | 5/2003 | Simons | |
| 6,562,146 B1 | 5/2003 | DeYoung | |
| 6,576,066 B1 * | 6/2003 | Namatsu | 134/30 |
| 6,596,093 B2 | 7/2003 | DeYoung | |
| 6,602,351 B2 | 8/2003 | DeYoung | |
| 6,613,157 B2 | 9/2003 | DeYoung | |
| 6,641,678 B2 | 11/2003 | Deyoung | |
| 6,669,785 B2 | 12/2003 | DeYoung | |
| 6,734,112 B2 | 5/2004 | Worm | |
| 6,735,978 B1 | 5/2004 | Tom | |
| 6,740,247 B1 | 5/2004 | Han et al. | |
| 6,763,840 B2 | 7/2004 | DeSimone | |
| 6,764,552 B1 | 7/2004 | Joyce et al. | |
| 6,905,555 B2 | 6/2005 | DeYoung | |
| 6,953,041 B2 | 10/2005 | DeYoung | |
| 7,011,716 B2 | 3/2006 | Xu | |
| 7,022,655 B2 | 4/2006 | Brask | |
| 7,044,143 B2 | 5/2006 | DeYoung | |
| 7,119,052 B2 | 10/2006 | Korzenski | |
| 7,129,160 B2 | 10/2006 | Chopra | |
| 7,141,496 B2 | 11/2006 | DeYoung | |
| 7,160,815 B2 | 1/2007 | Korzenski | |
| 7,223,352 B2 | 5/2007 | Korzenski | |
| 7,250,374 B2 | 7/2007 | Gale | |
| 7,291,565 B2 | 11/2007 | Hansen | |
| 8,153,533 B2 * | 4/2012 | DeYoung et al. | 438/745 |
| 2002/0014257 A1 * | 2/2002 | Chandra et al. | 134/19 |
| 2002/0112740 A1 | 8/2002 | DeYoung | |
| 2002/0112746 A1 * | 8/2002 | DeYoung et al. | 134/36 |
| 2002/0179126 A1 | 12/2002 | DeYoung | |
| 2003/0033676 A1 | 2/2003 | DeYoung | |
| 2003/0216269 A1 | 11/2003 | DeYoung | |
| 2004/0016450 A1 | 1/2004 | Bertram | |
| 2004/0020518 A1 | 2/2004 | DeYoung | |
| 2004/0045588 A1 | 3/2004 | DeYoung | |
| 2004/0050406 A1 | 3/2004 | Sehgal | |
| 2004/0071873 A1 | 4/2004 | DeYoung | |
| 2004/0221875 A1 | 11/2004 | Saga et al. | |
| 2005/0028927 A1 | 2/2005 | Basceri et al. | |
| 2005/0181135 A1 | 8/2005 | Ivanov | |
| 2006/0003592 A1 | 1/2006 | Gale | |
| 2006/0019850 A1 | 1/2006 | Korzenski et al. | |
| 2006/0180572 A1 | 8/2006 | Jacobson | |
| 2006/0186088 A1 | 8/2006 | Jacobson | |
| 2006/0194404 A1 * | 8/2006 | Dupont et al. | 438/397 |
| 2007/0095367 A1 | 5/2007 | Wang et al. | |
| 2007/0249156 A1 | 10/2007 | Bonilla et al. | |
| 2007/0289611 A1 | 12/2007 | Hayashi | |
| 2007/0293054 A1 | 12/2007 | Lee | |
| 2010/0184301 A1 | 7/2010 | Wagner et al. | |

FOREIGN PATENT DOCUMENTS

| | | |
|---|---|---|
| JP | 2007-335815 | 12/2007 |
| WO | WO2006/113621 | 10/2006 |
| WO | WO2006/138505 | 12/2006 |

OTHER PUBLICATIONS

Office Action dated Nov. 9, 2011 in U.S. Appl. No. 12/356,143.
International Search Report and Written Opinion for PCT Application No. PCT/US2010/020093, filed Jan. 5, 2010.
International Search Report and Written Opinion for PCT Application No. PCT/US2010/020086, filed Jan. 5, 2010.
Harris et al. Quantitative Chemical Analysis, Clancy Marshal, 1999, AP14 and AP19.
McClain et al. Design of Nonionic Surfactants for Supercritical Carbon Dioxide, Dec. 20, 1996, Science, vol. 274, pp. 2049-2052.
USPTO Office Action issued in U.S. Appl. No. 12/237,070 dated Sep. 27, 2011.
USPTO Office Action issued in U.S. Appl. No. 12/356,170 dated Oct. 17, 2011.
International Search Report and Written Opinion for PCT Patent Application No. PCT/US2009/057490—filed Sep. 18, 2009.
Goldfarb et al., "Aqueous-based photoresist drying using supercritical carbon dioxide to prevent pattern collapse," J. Vac. Sci. Technol. B, vol. 18, No. 6, Nov./Dec. 2000, pp. 3313-3317.

* cited by examiner

METHOD AND SYSTEM OF DRYING A MICROELECTRONIC TOPOGRAPHY

CROSS-REFERENCE TO RELATED APPLICATIONS

This application is a continuation-in-part of commonly assigned application Ser. No. 12/237,070 filed Sep. 24, 2008, now U.S. Pat. No. 8,153,533, titled "Method and systems for preventing feature collapse during microelectronic topography fabrication", which application is incorporated by reference herein as if reproduced in full below.

BACKGROUND

In semiconductor processing, many times a deionized water rinsing step is utilized to, for example, remove liquid etching agents, remove contaminants, and/or remove etch byproducts. However, as the aspect ratio (i.e., ratio of height to width) of various features on the semiconductor wafer (e.g., microelectronic features, and/or masking layers) continues to increase, surface tension of the deionized water may lead to feature collapse. For example, vertically oriented features may topple into each other, or horizontally oriented features may collapse onto the underlying structure. Regardless of the precise nature of the collapse, the collapse renders at least that portion of the microelectronic device, and in many case the entire device, unusable.

Thus, any advance in techniques for rinsing and drying of the features on a semiconductor wafer that reduce or eliminate feature collapse caused by surface tension of rinsing fluid would provide a competitive advantage.

BRIEF DESCRIPTION OF THE DRAWINGS

For a detailed description of exemplary embodiments, reference will now be made to the accompanying drawings in which.

NOTATION AND NOMENCLATURE

Figure 1:
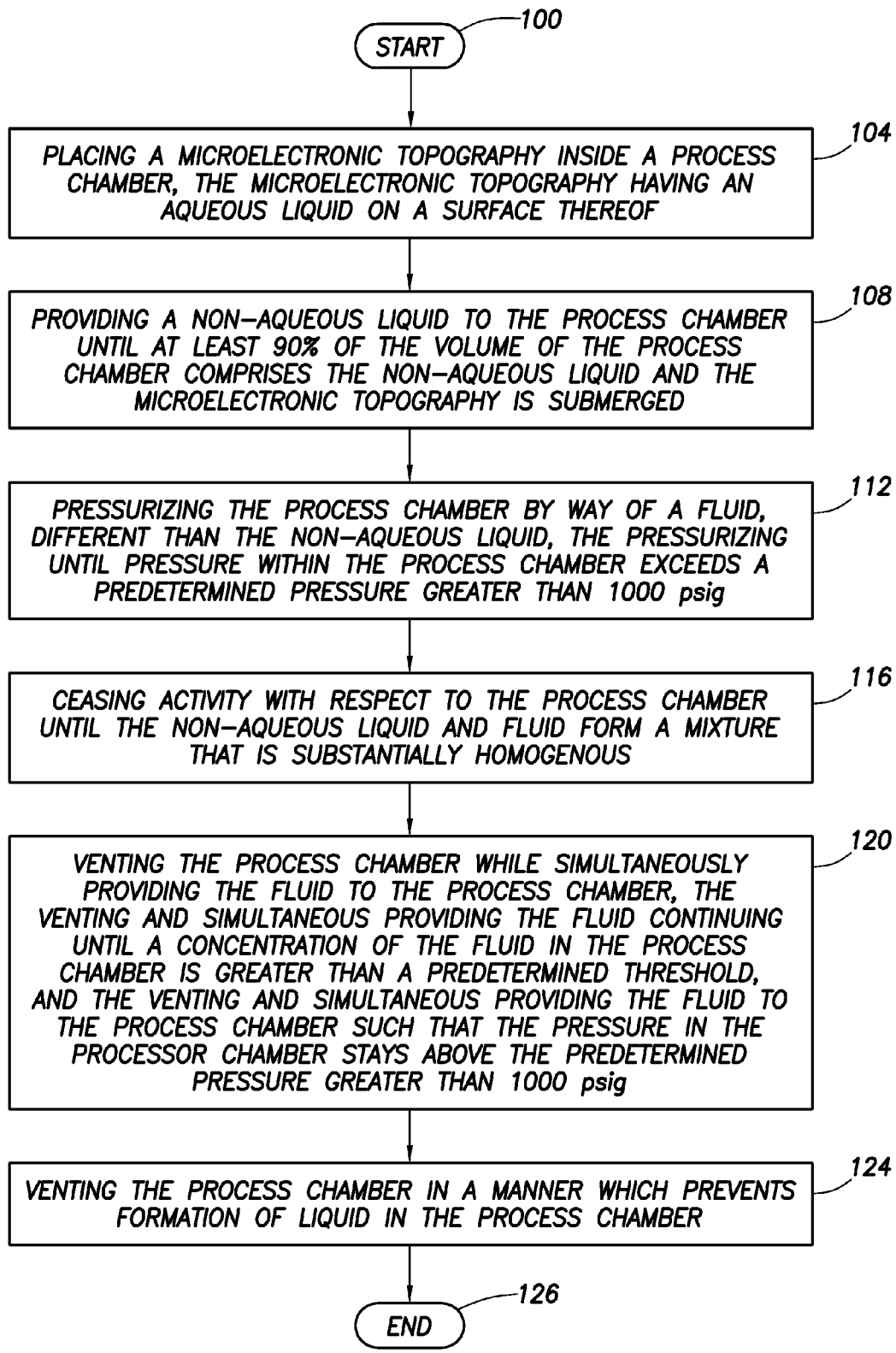
FIG. 1 shows a method in accordance with at least some embodiments.

Certain terms are used throughout the following description and claims to refer to particular system components. As one skilled in the art will appreciate, semiconductor companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Microelectronic topography" shall mean a topography having one or more layers and/or structures that form or partially form a microelectronic device and/or circuit (e.g., a memory cell, a micro-electrical-mechanical system (MEMS)). "Microelectronic topography" shall include topographies at any stage of fabrication and upon any suitable substrate (e.g., silicon, gallium-arsenic, indium phosphide, silicon-germanium, silicon-on-insulator, and silicon-on-sapphire).

"Fill", "filling" and "filled", in reference to providing a non-aqueous liquid to a process chamber, shall mean displacing substantially all the volume within a process chamber with the non-aqueous liquid such that there are no appreciable liquid-gas interfaces. However, the presence of liquid-gas interfaces in isolated regions (e.g., inlet ports for providing other liquids or gases, locations of limited size on the upper surfaces of the chamber where rising liquid traps gasses) shall not obviate the status of a process chamber as having been filled.

"Venting" shall mean the removal of fluids (whether subcritical or supercritical) from a process chamber. However, venting shall not be read to require discharging removed fluids to atmosphere, and thus whether the removed fluids are discharged into the atmosphere, provided to a scrubbing system, or stored in container, removal of the fluids shall still be considered venting.

"Critical pressure" shall be the pressure at or above which a fluid may transition to the state of a supercritical fluid (if the fluid is likewise at or above a critical temperature). However, raising the pressure of a fluid (or the pressure of a process chamber in which the fluid resides) to the critical pressure shall not be read to require that the fluid be in a supercritical fluid state—a fluid may be at or above the critical pressure, yet not have sufficient temperature to be a supercritical fluid.

"Critical temperature" shall be the temperature at or above which a fluid may transition to the state of a supercritical fluid (if the fluid is likewise at or above a critical pressure). However, raising the temperature of a fluid to the critical temperature shall not be read to require that the fluid be in a supercritical fluid state—a fluid may be at or above the critical temperature, yet not have sufficient pressure to be a supercritical fluid.

"Non-aqueous liquid" shall mean a substance that contains 25% or less water by weight. For example, anhydrous ethanol is a non-aqueous liquid, but also an ethanol and water mixture, where water is less than 25% by weight, shall also be considered a non-aqueous liquid.

"Aqueous liquid" shall mean a substance that contains water alone, or water and another solvent.

"Rinse liquid" shall mean a substance applied to a microelectronic topography as part of a rinse step (e.g., an aqueous liquid), or a substance applied to a microelectronic topography to dilute or remove a substance applied in a rinse step (e.g., to dilute or remove an aqueous liquid).

When a first fluid or substance is said to be miscible with a second fluid or substance, the relationship shall mean that the first fluid or substance is different than the second fluid or substance.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

At certain stages during construction of microelectronic topographies on semiconductor wafers, the microelectronic topographies are rinsed. For example, after a wet etch process (e.g., to remove portions of an oxide layer), the microelectronic topography may be rinsed in a deionized water to remove the etch fluid and/or remove etch byproducts. Likewise, after a dry etch process (e.g., plasma etching), the microelectronic topography may be rinsed in deionized water to remove the residual etch gasses and/or remove etch byproducts. In this case, the 'rinse' may be applied subsequent to another wet process, such as a cleaning step. In many cases the rinsing is performed using deionized water, or a combination of deionized water and other solvent (hereafter "aqueous liquid", whether deionized water or combinations with other solvents). However, as the aspect ratio of the features of the microelectronic topographies increases (i.e., the height of the features increases in relation to the width of the features), surface tension of the aqueous liquid, and subsequent unbalanced capillary forces, may damage the microelectronic topographies, particularly during drying by evaporation of the aqueous liquid.

The various embodiments are directed to removal of the liquids from the microelectronic topographies after rinsing such that the damage caused by surface tension of the aqueous liquid, and/or interfacial tension with other fluids, is reduced or eliminated. In particular, FIG. 1 illustrates a method in accordance with at least some embodiments. Though the illustrative method of FIG. 1 shows various steps in a particular order, the method may be equivalently implemented by additional steps, steps performed in a different order, and/or some steps omitted. The method starts (block 100) and proceeds to placing a microelectronic topography in a process chamber (block 104). In some embodiments, the microelectronic topography is rinsed with the aqueous liquid prior to being placed in the process chamber, and thus the microelectronic topography has the aqueous liquid on a surface thereof as the microelectronic topography is placed in the process chamber. In other embodiments rinsing of the microelectronic topography takes place in the process chamber, and thus the microelectronic topography may acquire the aqueous liquid on the surface within the process chamber.

Regardless of whether the aqueous liquid is carried into the process chamber on microelectronic topography or is acquired in the process chamber, the next step in the illustrative process is providing a non-aqueous liquid to the process chamber until at least 90% of the volume of the process chamber comprises non-aqueous liquid and the microelectronic topography is submerged (block 108). In some cases at least 95% of the volume of the process chamber comprises the non-aqueous liquid, while in other cases the process chamber is filled with the non-aqueous liquid. Moreover, in a particular embodiment the non-aqueous liquid is provided to the process chamber while the pressure within the process chamber is substantially atmospheric pressure, but other higher and lower pressures may be equivalently used. In some cases, the non-aqueous liquid is heated prior to entry into the process chamber. The non-aqueous liquid is selected such that water is miscible with the non-aqueous liquid, and once the microelectronic topography is submerged in the non-aqueous liquid, the aqueous liquid and non-aqueous liquid eventually form a homogenous mixture. Thus, at this stage the aqueous liquid is still present in the process chamber, but in a mixture with the non-aqueous liquid. In some embodiments, the non-aqueous liquid is a polar or non-polar organic solvent or solvent mixture with a molecular weight less than approximately 150 atomic mass units (amu). Illustrative polar solvents suitable as the non-aqueous liquid comprise ethanol, methanol, propanol, isopropanol and acetone. Illustrative non-polar solvents suitable as the non-aqueous liquid comprise hexane, pentane and heptane. In the case of non-polar solvents, ionic or non-ionic surfactants may also be used, and illustrative surfactants comprise ammonium salts of perfluoropolyether carboxylates ($PFPECOONH_4$), sodium salt of bis(1H,1H,2H,2H-tridecafluor-octyl)-2-sulfosuccinate (F-AOT), and branched secondary alcohol ethoxylates (TMN-6, TMN-(10)). Other surfactants may be equivalently used.

Next, the process chamber is pressurized with a pressurizing fluid, the fluid different than the non-aqueous liquid (block 112). The pressurizing fluid is added to the process chamber until the pressure within the process chamber exceeds a predetermined pressure greater than 1000 pounds per square inch gauge (psig). The pressurizing fluid is selected such: that non-aqueous liquid is miscible with the pressurizing fluid; the pressurizing fluid has a low surface tension (e.g., less than approximately 30 dynes/cm); and temperatures and pressures where the pressurizing fluid becomes supercritical are relatively easy to achieve (i.e., having a relatively low critical temperature and critical pressure). In a particular embodiment the pressurizing fluid is carbon dioxide, and in other embodiments the pressurizing fluid is sulfur hexafluoride, but any pressurizing fluid meeting the criteria above may be equivalently used. In a particular embodiment, the predetermined pressure is a pressure at or above the critical pressure of the fluid (e.g., between 1100 psig and 4000 psig, or between 1500 psig and 2900 psig).

Pressurizing the process chamber with the fluid may itself take place in several distinct steps. For example, when the pressurizing fluid is carbon dioxide, initially gaseous carbon dioxide may be added to the process chamber until the pressure in the process chamber reaches the saturated vapor pressure of carbon dioxide—approximately 850 psig at ambient temperature. Thereafter, the illustrative carbon dioxide may be pumped into the process chamber in liquid form until the pressure in the process chamber reaches the predetermined pressure. As will be discussed more below, pressurizing fluid in the processor chamber eventual becomes supercritical, and to help achieve the critical temperature, in some embodiments the pressurizing fluid is heated prior to entry into the process chamber.

Once the process chamber is pressurized to the predetermined pressure, the illustrative method moves to ceasing activity with respect to the process chamber until the aqueous liquid, non-aqueous liquid and the pressurizing fluid form a mixture that is substantially homogenous (i.e., becomes single phase) (block 116). In some embodiments, the amount of time used to ensure that the non-aqueous liquid and pressurizing fluid form a substantially homogenous mixture is 30 seconds or less, and in some cases 10 seconds or less, based on the volume percentage of the pressurizing fluid used to pressurize the process chamber to the predetermined pressure. In some cases, the critical pressure may be reached when the concentration of the mixture in the process chamber is about 95% non-aqueous liquid and about 5% pressurizing fluid, and at these illustrative concentrations the mixture may be homogenous substantially upon entry of the pressurizing fluid into the process chamber. At this stage the aqueous liquid is still in the process chamber as a mixture with the non-aqueous liquid and the pressurizing fluid.

The next step in the illustrative method is venting the process chamber while simultaneously providing the pressurizing fluid to the process chamber (block 120), the venting and simultaneously providing performed such that the process chamber stays above the predetermined pressure. Thus, the term "pressurizing fluid" shall not be construed to be used only for pressurization, as the pressurizing fluid also functions to dissolve and displace the non-aqueous liquid (and aqueous liquid) in the process chamber. In some embodiments, the venting and simultaneously providing continues until the concentration of the pressurizing fluid in the process chamber is greater than a predetermined threshold. In a particular embodiment, the pressurizing fluid is heated prior to entry into the process chamber, and in many cases heated to at least the critical temperature of the pressurizing fluid. The venting and simultaneously providing the fluid act to flush by changing the concentration of non-aqueous liquid and the pressurizing fluid in the process chamber over time.

Moreover, during the process of venting and simultaneously providing the pressurizing fluid, the mixture in the process chamber transitions to a supercritical state. As mentioned above, the predetermined pressure is at or above the critical pressure for the pressurizing fluid, and in a particular embodiment the pressurizing fluid is heated prior to entry into the process chamber. Moreover, the process chamber itself may be heated to raise the temperature of the mixture in the processor chamber and/or to help maintain the mixture in the process chamber at or above the critical temperature of the pressurizing fluid. Stated otherwise, while the mixture in the process chamber may initially be at or above the critical pressure and temperature for the pressurizing fluid considered alone, because the concentration of the pressurizing fluid in the mixture is initially relatively low, the mixture may not be in a supercritical state. However, as the concentration of the pressurizing fluid increases by way of the venting the process chamber and simultaneously providing the pressurizing fluid, at a certain concentration the mixture transitions to a supercritical state.

Consider, as an example, embodiments where the process chamber is filled with the non-aqueous liquid being ethanol (block 108) and then pressurized with carbon dioxide (block 112). When the predetermined pressure is reached, the mixture in the process chamber may be on the order of about 95% ethanol and 5% carbon dioxide. By simultaneously venting the process chamber and providing the illustrative carbon dioxide, the concentration of carbon dioxide increases. In a particular embodiment, the venting and simultaneously providing cease when the concentration of carbon dioxide is about 95% or above, and in particular cases the venting and simultaneously providing cease when the concentration of carbon dioxide is about 99% or above. In other cases, the venting and simultaneously providing may cease at any point after the mixture reaches the supercritical state.

The final step in the illustrative method is venting of the process chamber in a manner which prevents formation of liquid in the process chamber (block 124). In particular, once the concentration of the pressurizing fluid in the mixture within process chamber is greater than the predetermined concentration (and the mixture is in a supercritical state), then substantially all the water and other solvent used to rinse the microelectronic topography has been removed, and there is little or no surface tension in the mixture because of the supercritical condition of the mixture. By venting the process chamber in a manner that prevents formation of liquid in the process chamber, the "drying" process is completed without having exposed the features of the microelectronic topography to the surface tension associated with evaporative drying the aqueous liquid. In some embodiments, venting (again block 124) is performed in such a way that direct transition of the pressuring fluid from the supercritical state to the gas state is achieved. In other embodiments, the venting is achieved by displacing the pressurizing fluid within the process chamber with a different fluid, such as helium, argon, nitrogen, oxygen, or mixtures of thereof.

Before delving into a system to implement the illustrative method, a few points regarding the amount of non-aqueous liquid used in the process chamber are instructive. Firstly, it is noted that providing the non-aqueous liquid to the process chamber until at least 90% of the volume comprises the non-aqueous liquid, or filling the processing chamber, is a counterintuitive step. In particular, the surface tension of a mixture of a non-aqueous liquid and the pressurizing fluid is higher at higher concentrations of the non-aqueous liquid, and lower at the lower concentrations of the non-aqueous liquid. Inasmuch as the overall goal is to remove the aqueous liquid with fluid having low surface and/or low interfacial tension, the tendency is to use as little non-aqueous liquid as possible, and as much pressurizing fluid as possible. In other words, when the mixture of the non-aqueous liquid and the pressurizing fluid is created in the process chamber, the tendency is to use very little non-aqueous liquid such that the mixture has low surface and/or interfacial tension.

However, the inventors of the present specification have found that by using relatively high concentrations of the non-aqueous liquid, and relatively low concentrations of pressurizing fluid in the pressurizing step, the amount of time needed for the non-aqueous liquid (and absorbed aqueous liquid) and pressurizing fluid to form a homogenous mixture is substantially reduced. For example, in the illustrative case of ethanol as the non-aqueous liquid filling the process chamber and carbon dioxide as the pressurizing fluid, the amount of time needed for the ethanol and carbon dioxide to form a homogenous mixture after the critical pressure is reached during pressurizing is 30 seconds or less. In some cases, the carbon dioxide and ethanol form a homogenous mixture substantially simultaneously with the carbon dioxide entering the process chamber, such that the venting and simultaneously providing the fluid may begin with little or no ceasing or dwell time. By contrast, methods and systems that utilize a relatively small amount of ethanol (e.g., 25% of the volume of the process chamber) may require two to three minutes, or more, for the carbon dioxide and ethanol to form a homogenous mixture. Allowing the mixture to become homogenous before further processing reduces the possibility of the microelectronic topography from being exposed to interfacial tensions.

Figure 3:
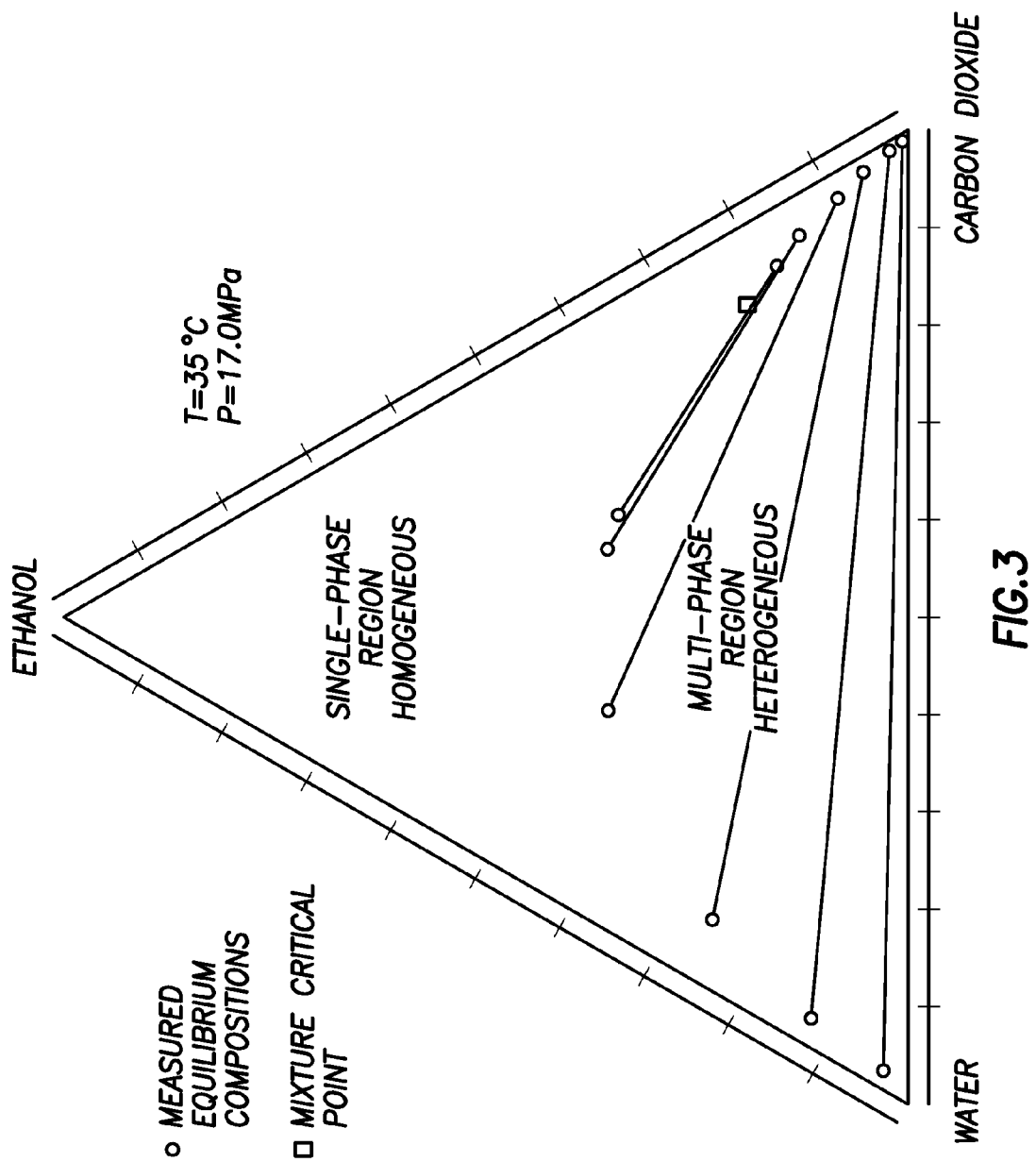
FIG. 3 shows an illustrative ternary phase diagram.

Secondly, by using greater volume non-aqueous liquid, greater volumes of aqueous liquid may be removed from the microelectronic topography. In particular, and in the illustrative case of the non-aqueous liquid being ethanol and the pressurizing fluid being carbon dioxide, since water has a very low solubility in many supercritical fluids like dense carbon dioxide, polar cosolvents like ethanol can be used to greatly enhance the solubility of water in dense carbon dioxide mixtures. Higher aqueous solubility maintained in homogeneous phase behavior reduces or eliminates interfacial tension forces present in multiple phase fluid systems. FIG. 3 shows an illustrative ternary phase diagram of dense carbon dioxide mixtures with water and ethanol, where the phase behavior of the dense carbon dioxide systems can be identified as a function of composition. Evaluation of the ternary phase diagram of FIG. 3 shows that increases in the amount of water relative to the carbon dioxide at a temperature of 35° C. and a pressure of 17 Mega Pascals (MPa) implies larger amounts of ethanol to avoid a heterogeneous multiphase system. Based on FIG. 3, a drying system that has as much as 15% water, with 80% ethanol and 5% carbon dioxide, would still be homogenous and therefore interfacial tension would not be an issue. Conversely, a system that is 20% ethanol, 15% water, and 65% carbon dioxide, the phase diagram predicts that this system would be multiphase heterogeneous, thus exposing the microelectronic topographies to interfacial tension that could cause damage.

The ability to remove greater volumes aqueous liquid translates into at least two possible processing cycle time reductions. The first cycle time reduction is that less processing may be needed to reduce the amount of water prior to implementing the method of FIG. 1. For example, in some embodiments the amount of water on a microelectronic topography may be lowered by rinsing in successively (in some cases linearly) changing concentrations of deionized water and polar solvent (which polar solvent is soluble in the pressuring fluid), starting with higher concentration of deionized water, and ending with lower concentrations of deionized water. With the volume of non-aqueous liquid giving rise to the ability to absorb more water, the rinsing of the microelectronic topography may be with deionized water alone, or at least ending with higher concentration of deionized water. Relatedly, the ability to remove more aqueous liquid means the illustrative method above may be applied as a batch process to a plurality of microelectronic topographies on a respective plurality of separate and distinct substrates. The reduced cycle time and/or batch processing ability make the economics of drying according to the various embodiments better than methods and systems that use reduced amounts of non-aqueous liquid and/or single wafer processing.

Figure 2:
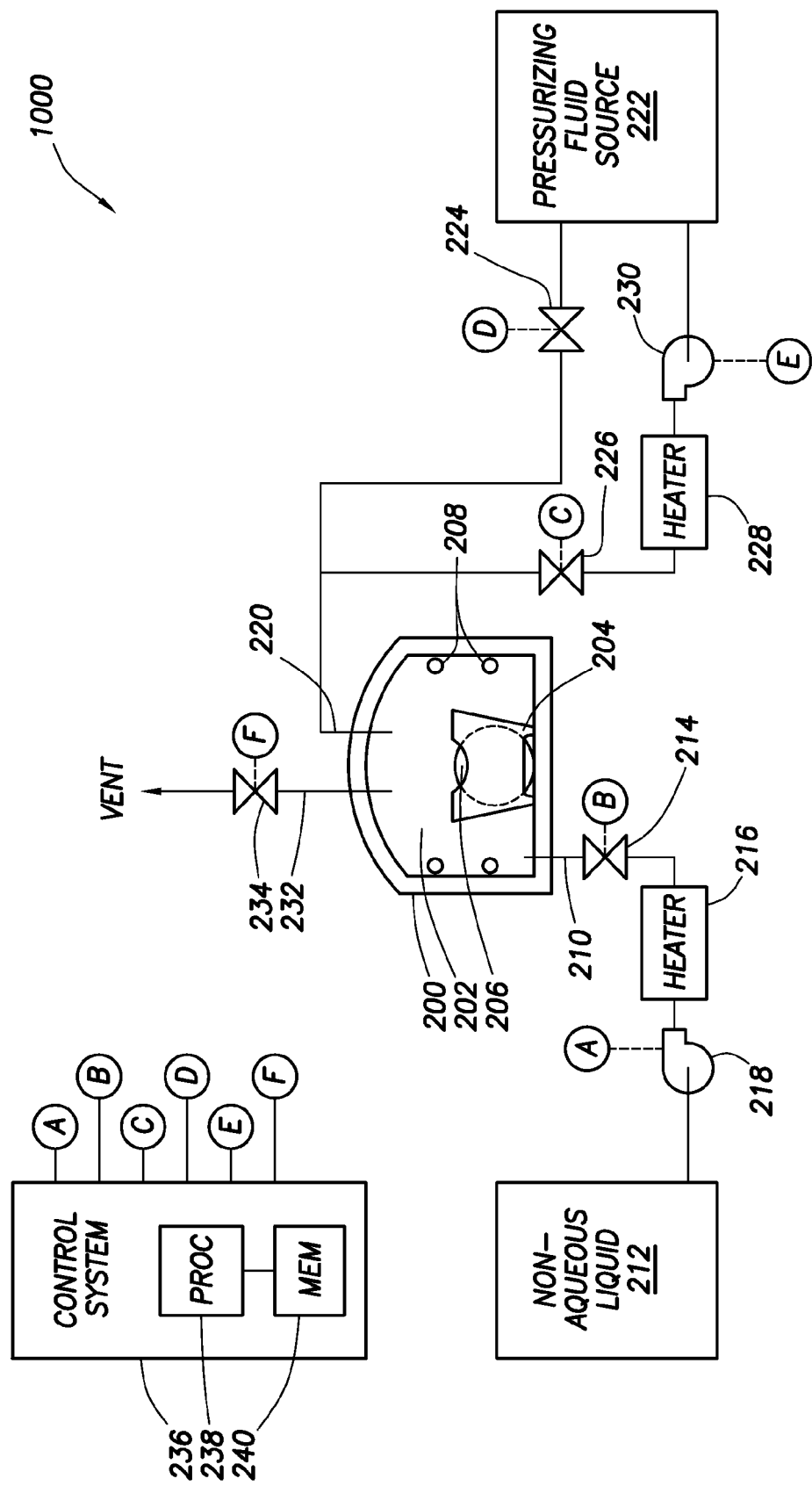
FIG. 2 shows a system in accordance with at least some embodiments.

FIG. 2 illustrates a system 1000 in accordance with at least some embodiments. In particular, the system comprises a process chamber 200, shown in cross-sectional view. The process chamber 200 is made of metallic material, and defines an internal volume 202. The process chamber 200 is configure to withstand or contain pressure within the internal volume 202 at or above the critical pressure of the pressurizing fluid when the pressure outside the process chamber 200 is substantially atmospheric pressure. Disposed within the internal volume 202 of the process chamber 200 is substrate holder 204, here illustrated as a wafer carrier. The substrate holder is configured to hold or support at least one wafer or substrate 206. As shown, the substrate is held in a vertical orientation, but the substrate may be equivalently held in a substantially horizontal orientation. Moreover, the substrate holder 204 may hold a plurality of distinct substrates 206, each substrate comprising at least one microelectronic topography. In some embodiments, the process chamber 200 is configured to enable placement of the substrate holder 204 within the internal volume 202, and remove the substrate holder 204 from the internal volume (e.g., a door or lid). In other cases, the substrate holder 204 may stay within the internal volume 202, and the substrates may be selectively inserted and removed from the internal volume.

The metallic material that makes up the process chamber 200 may be heated, such as by heat exchanger tubing 208. While the heat exchanger tubing is shown within the internal volume 202, the heat exchanger tubing 208 may equivalently reside on an exterior surface of the process chamber 200, and/or both on the exterior surface and the interior surface. In a particular embodiment, the metallic material of the process chamber 200 is held at or above the critical temperature of the pressurizing fluid. For example, if the pressurizing fluid is carbon dioxide, the metallic material may be heated to a temperature of greater than or equal to 31° Celsius (C), and if the pressurizing fluid is sulfur hexafluoride the metallic material may be heated to a temperature of greater than or equal to 45.5° C.

Still referring to FIG. 2, the system 1000 further comprises a plurality of fluid inlet ports that fluidly couple to the internal volume 202. In particular, system 1000 comprises a first fluid inlet port 210 that fluidly couples to a source of non-aqueous liquid 212. While the first fluid inlet port 210 is shown to feed into the bottom of the internal volume 202, the first fluid inlet port 210 may equivalently feed into the internal volume 202 at any suitable location. In the particular embodiment illustrated by FIG. 2, the first fluid inlet port 210 couples to the source of non-aqueous liquid by way of a valve 214, heater 216 and pump 218. The valve 214 may control when the non-aqueous liquid enters the process chamber 200 and/or the rate at which the non-aqueous liquid enters the process chamber 200. While pump 218 is illustrated, the pump 218 may be omitted in situations where other forces are used to move the non-aqueous liquid from the source of non-aqueous liquid 212 to the internal volume 202, such as gravity feed. Heater 216, if present, is used to heat the non-aqueous liquid prior to entry into the process chamber 200. The heater 216 may be of any suitable type, such as a heat exchanger that exchanges heat with another fluid, or the heater may comprise other heat sources, such as resistive heaters. In some embodiments, it may be advantageous to heat the non-aqueous liquid to ensure stable temperature of the process chamber 200 and/or earlier transition of the mixture to a supercritical state after pressurizing. Thus, the system 1000 is configured provide the non-aqueous liquid through first fluid inlet port 210 to the internal volume until at least 90% of the internal volume 202 of the process chamber 200 comprises the non-aqueous liquid.

System 1000 further comprises a second fluid inlet port 220 that fluidly couples to a source of pressurizing fluid 222. While the second fluid inlet port 220 is shown to feed into the top of the internal volume 202, the second fluid inlet port 220 may equivalently feed into the internal volume 202 at any suitable location. The second fluid inlet port 220 should be a sufficient distance from the substrate(s) 206 that as the pressurizing fluid enters the internal volume 202 the semiconductor wafer(s) are not exposed to localized interfaces between non-aqueous liquid and the pressurizing fluid as those fluids are mixing and becoming homogenous. In the particular embodiment illustrated by FIG. 2, the second fluid inlet port 220 couples to the source of pressurizing fluid 222 by two paths: the first path through valve 224; and the second path through valve 226, heater 228 and pump 230. The valve 224 controls when the pressurizing fluid enters the process chamber 200, and/or the rate at which the non-aqueous liquid enters the process chamber 200, when the pressure in the process chamber is below a particular value. For example, if the pressurizing fluid is carbon dioxide in liquid form in the source 222, the carbon-dioxide may flow to the process chamber 200 based solely on the pressure of the carbon dioxide in the source 222 until the pressure in the process chamber 200 reaches the saturated vapor pressure of carbon dioxide of about 850 psig.

At or near the pressure in the process chamber where the pressurizing fluid will no longer flow to the process chamber without assistance, the second path may be used. In particular, pump 230 is used to increase the pressure of the pressurizing fluid provided to the process chamber 200 through the second fluid inlet port 220. Heater 228 is used to heat the pressurizing fluid prior to entry into the process chamber 200. The heater 228 may be of any suitable type, such as a heat exchanger that exchanges heat with another fluid, or the heater may comprise other heat sources, such as resistive heaters. In a particular embodiment, the pressurizing fluid is heated to at or near the critical temperature of the pressurizing fluid. For example, if the pressurizing fluid is carbon dioxide, the heater 228 may raise the temperature of the carbon dioxide to between 31° C. and 60° C., and more particularly between 31° C. and 40° C. It is noted that having two separate paths to feed the pressurizing fluid to the second fluid inlet port 220 is merely illustrative. In some embodiments the pressurizing fluid flows through the pump 230 when the pump is not in operation, and thus providing the pressurizing fluid to the process chamber 200 until the pressure within the processor chamber 200 reaches the saturated vapor pressure of the pressurizing fluid may be through the pump 230 with the pump 230 not in operation. Thus, regardless of whether two paths are used or just one, the system 1000 is configured such that when the internal volume comprises the at least 90% non-aqueous liquid, the system pressurizes the internal volume with pressurizing fluid to above a predetermined pressure greater than 1000 psig.

System 1000 further comprises a vent port 232 coupled to valve 234. While vent port 232 is shown near the top of the process chamber 200, the vent port 232 may be equivalently placed at any suitable location. The system 1000 is configured to vent fluid from the internal volume 202 by way of the vent port 234 while simultaneously providing the pressurizing fluid to the internal volume 202, all while maintaining the pressure within the process chamber 200 above the predetermined pressure. At other times, the system 1000 is configured to vent the internal volume 202 to atmospheric pressure in such a way that substantially no liquid forms in the internal volume. In some cases, when providing the non-aqueous liquid to the internal volume 202, the vent port 232 may be used to vent the displaced fluid (e.g., atmospheric air).

Still referring to FIG. 2, the system 1000 further comprises a control system 236. The control system 236 is a computer system having, for example, a processor 238 and a memory 240. The memory 240, being any suitable computer-readable medium, stores programs executable by the processor 238. The programs stored on the memory 240 may implement any and/or all the steps of the illustrative method of FIG. 1 by control of the various pumps, valves and heaters. The control system 236 couples to and controls the various valves 214, 224, 226 and 234, and the various pumps 218 and 230. Moreover, the control system 236 may likewise control other equipment, not specifically shown, to control temperature of the process chamber and the amount of heat added to the respective fluids by the heaters 216 and 228.

So as not to unduly complicate the description, the various embodiments discussed to this point have been directed to removal of an aqueous liquid from the microelectronic topography; however, removal of the aqueous liquid in the manner described is merely illustrative. In other embodiments, the rinse liquids that are free of water may also be removed from the microelectronic topography using the methods and systems described above. For example, after rinsing in an aqueous liquid, the microelectronic topography may be further rinsed in a second solvent (e.g., isopropyl alcohol, ethylene glycol) until the aqueous liquid is fully removed (i.e., the water is fully removed). Thereafter, the second solvent may be removed or "dried" according to the methods and systems described above.

The above discussion is meant to be illustrative of the principles and various embodiments of the present invention. Numerous variations and modifications will become apparent to those skilled in the art once the above disclosure is fully appreciated. For example, in situations where the microelectronic topography is rinsed outside the process chamber, it may be advantageous to transfer the microelectronic topography into the process chamber submerged in the aqueous liquid, and as such the substrate holder 204 may be a liquid container. Moreover, while in the various embodiments no agitation of the non-aqueous liquid and pressurizing fluid is used to created the homogenous mixture (i.e., during the ceasing or dwell time), agitation within the process chamber may be used to accelerate the time to achieve the homogenous mixture). It is intended that the following claims be interpreted to embrace all such variations and modifications.

We claim:

1. A method comprising:
    providing a microelectronic topography having a surface;
    placing the microelectronic topography having a rinse liquid on the surface inside a process chamber;
    providing a non-aqueous liquid to the process chamber until at least 90% of the volume of the process chamber comprises the non-aqueous liquid and the microelectronic topography is submerged in the non-aqueous liquid;
    pressurizing the process chamber by way of a fluid, different than the non-aqueous liquid, until pressure within the process chamber exceeds a predetermined pressure of greater than 1000 psig;
    ceasing activity with respect to the process chamber until the non-aqueous liquid and fluid form a mixture within the process chamber that is substantially homogenous, wherein an amount of time for forming the mixture is less than thirty seconds after the predetermined pressure within the process chamber is reached;
    venting the process chamber while simultaneously providing the fluid in a supercritical state to the process chamber, wherein the pressure in the process chamber stays above the predetermined pressure of greater than 1000 psig; and then
    venting the process chamber in a manner which transitions the fluid from the supercritical state to a gaseous state.

2. The method of claim 1 further comprising:
    wherein providing the non-aqueous liquid further comprises providing ethanol; and
    wherein pressurizing the process chamber by way of the fluid further comprises pressurizing with carbon dioxide.

3. The method of claim 1 wherein providing the non-aqueous liquid further comprises providing the non-aqueous liquid to the process chamber until at least 95% of the volume of the process chamber comprises the non-aqueous liquid.

4. The method of claim 1 wherein pressurizing the process chamber further comprises pressurizing the process chamber by way of the fluid until the process chamber reaches a pressure equal to or greater than a critical pressure of the fluid.

5. The method of claim 1 wherein pressurizing the process chamber further comprises pressurizing the process chamber to between 1100 psig and 4000 psig.

6. The method of claim 1 wherein pressurizing the process chamber further comprises pressurizing the process chamber to between 1500 psig and 2900 psig.

7. The method of claim 1 wherein providing the fluid to the process chamber further comprises heating the fluid prior to entry into the process chamber.

8. The method of claim 1 wherein placing the microelectronic topography further comprises placing the microelectronic topography with an aqueous liquid on the surface thereof.

9. The method of claim 1 wherein providing the non-aqueous liquid further comprises providing the non-aqueous liquid at atmospheric pressure.

10. The method of claim 1 further comprising selecting at least one of said non-aqueous liquid from the group consisting of: ethanol, methanol, propanol, isopropanol, acetone, hexane, pentane, and heptane.

11. The method of claim 1, further comprising selecting at least one of said fluid from the group consisting of: carbon dioxide and sulfur hexafluoride.

12. The method of claim 1 wherein the non-aqueous liquid further comprises an ionic or non-ionic surfactant.

13. The method of claim 1 wherein the placing the microelectronic topography inside the process chamber comprises placing a plurality of microelectronic topographies on a respective plurality of separate substrates in a batch process inside the process chamber.

14. The method of claim 1 wherein forming the non-aqueous liquid and fluid into a substantially homogenous mixture comprises agitation of the non-aqueous liquid and fluid within the process chamber.

15. A method comprising:
providing a microelectronic topography having a surface;
placing the microelectronic topography having a rinse liquid on the surface inside a process chamber;
filling the process chamber with a non-aqueous liquid absent of carbon dioxide; and then
pressurizing the process chamber with carbon dioxide, until pressure within the process chamber exceeds a predetermined pressure of greater than 1000 psig;
ceasing activity with respect to the process chamber until the non-aqueous liquid and the carbon dioxide form a mixture that is substantially homogeneous;
venting the process chamber while simultaneously providing carbon dioxide in a supercritical state to the process chamber until a concentration of the carbon dioxide in the process chamber is greater than a predetermined threshold, wherein the pressure in the process chamber stays above the predetermined pressure of greater than 1000 psig; and then
venting the process chamber in a manner which transitions the carbon dioxide from the supercritical state to a gaseous state.

16. The method of claim 15 further comprising selecting at least one of said non-aqueous liquid from the group consisting of: ethanol, methanol, propanol, isopropanol, acetone, hexane, pentane, and heptane.

17. The method of claim 15 wherein the non-aqueous liquid absent of carbon dioxide further comprises an ionic or non-ionic surfactant.

18. The method of claim 15 wherein pressurizing the process chamber further comprises pressurizing the process chamber with said carbon dioxide until the process chamber reaches a pressure equal to or greater than a critical pressure of said carbon dioxide.

19. The method of claim 15 wherein pressurizing the process chamber further comprises pressurizing the process chamber to between 1500 psig and 2900 psig.

20. The method of claim 15 wherein providing the carbon dioxide to the process chamber further comprises heating the carbon dioxide prior to entry of the carbon dioxide into the process chamber.

21. The method of claim 15 wherein providing the non-aqueous liquid further comprises providing the non-aqueous liquid at atmospheric pressure.

22. A method comprising:
providing a microelectronic topography having a surface;
placing the microelectronic topography having a rinse liquid on the surface inside a process chamber;
providing a non-aqueous liquid to the process chamber until at least 90% of the volume of the process chamber comprises the non-aqueous liquid and the microelectronic topography is submerged in the non-aqueous liquid;
pressurizing the process chamber by way of a fluid, different than the non-aqueous liquid, until pressure within the process chamber exceeds a predetermined pressure of greater than 1000 psig;
ceasing activity with respect to the process chamber until the non-aqueous liquid, the rinse liquid, and the fluid form a mixture in the process chamber that is substantially homogeneous;
venting the process chamber while simultaneously providing the fluid in a supercritical state to the process chamber, wherein the pressure in the process chamber stays above the predetermined pressure of greater than 1000 psig; and then
venting the process chamber in a manner which transitions the fluid from the supercritical state to a gaseous state.

23. The method of claim 22 wherein providing the non-aqueous liquid further comprises providing the non-aqueous liquid to the process chamber until at least 95% of the volume of the process chamber comprises the non-aqueous liquid.

24. The method of claim 22 wherein pressurizing the process chamber further comprises pressurizing the process chamber by way of the fluid until the process chamber reaches a pressure equal to or greater than a critical pressure of fluid.

25. The method of claim 2 wherein the mixture in the process chamber comprises about 5% fluid by volume.

26. The method of claim 22 wherein pressurizing the process chamber further comprises pressurizing the process chamber to between 1100 psig and 4000 psig.

27. The method of claim 22 wherein pressurizing the process chamber further comprises adding the fluid to the process chamber until pressure in the process chamber reaches a saturated vapor pressure of the fluid.

28. A method comprising:
providing a microelectronic topography having a surface;
placing the microelectronic topography having a rinse liquid on the surface inside a process chamber;
providing a non-aqueous liquid to the process chamber until at least 80% of the volume of the process chamber comprises the non-aqueous liquid and the microelectronic topography is submerged in the non-aqueous liquid;
pressurizing the process chamber by way of a fluid, different than the non-aqueous liquid, until pressure within the process chamber exceeds a predetermined pressure of greater than 1000 psig, wherein the fluid pressurizing the process chamber comprises less than 20% of the volume of the process chamber;
ceasing activity with respect to the process chamber until the non-aqueous liquid and fluid form a mixture that is substantially homogeneous within the process chamber;
venting the process chamber while simultaneously providing the fluid to the process chamber, wherein the pressure in the process chamber stays above the predetermined pressure of greater than 1000 psig; and then
venting the process chamber in a manner which transitions the fluid from the supercritical state to a gaseous state.

* * * * *